US009628076B2

(12) United States Patent
Hasegawa

(10) Patent No.: US 9,628,076 B2
(45) Date of Patent: Apr. 18, 2017

(54) TRANSMISSION CIRCUIT AND SEMICONDUCTOR INTEGRATED CIRCUIT

(71) Applicant: Socionext Inc., Yokohama-shi, Kanagawa (JP)

(72) Inventor: Nobumasa Hasegawa, Kawasaki (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 15/136,374

(22) Filed: Apr. 22, 2016

(65) Prior Publication Data

US 2016/0241235 A1    Aug. 18, 2016

Related U.S. Application Data

(63) Continuation of application No. PCT/JP2014/073367, filed on Sep. 4, 2014.

(51) Int. Cl.
*H03K 3/00* (2006.01)
*H03K 17/687* (2006.01)
(Continued)

(52) U.S. Cl.
CPC .......... *H03K 17/687* (2013.01); *H01L 23/66* (2013.01); *H03F 3/2173* (2013.01); *H03F 3/45071* (2013.01); *H03F 3/45179* (2013.01); *H03K 19/0175* (2013.01); *H03K 19/017545* (2013.01); *H03M 9/00* (2013.01); *H04L 25/00* (2013.01); *H01L 2223/665* (2013.01); *H01L 2223/6638* (2013.01); *H01L 2223/6655* (2013.01);
(Continued)

(58) Field of Classification Search
None
See application file for complete search history.

(56) References Cited

U.S. PATENT DOCUMENTS

| 7,898,295 | B1 |   | 3/2011 | Kasturirangan et al. |
|---|---|---|---|---|
| 8,823,457 | B1 | * | 9/2014 | Mossawir ............... H03F 1/523 330/207 P |

(Continued)

FOREIGN PATENT DOCUMENTS

| JP | 2001-251149 A | 9/2001 |
|---|---|---|
| JP | 2008-147940 A | 6/2008 |

(Continued)

OTHER PUBLICATIONS

International Search Report and Written Opinion of the International Searching Authority of PCT Patent Application No. PCT/JP2014/073367 dated Dec. 2, 2014, with partial English translation.

*Primary Examiner* — Lincoln Donovan
*Assistant Examiner* — Khareem E Almo
(74) *Attorney, Agent, or Firm* — Arent Fox LLP

(57) ABSTRACT

A transmission circuit includes a driver circuit that includes: a transistor to regulate output impedance, and a switching circuit that is connected to the transistor to regulate output impedance and switches an output polarity for differential output; and a bias circuit that includes: a first replica circuit including another transistor corresponding to the transistor to regulate output impedance, the bias circuit generating a gate voltage so as to make a current-voltage characteristic of the transistor to regulate output impedance correspond to a first output impedance value, and supply the gate voltage to a gate of the transistor to regulate output impedance.

16 Claims, 7 Drawing Sheets

(51) Int. Cl.
*H03K 19/0175* (2006.01)
*H01L 23/66* (2006.01)
*H03F 3/45* (2006.01)
*H03M 9/00* (2006.01)
*H04L 25/00* (2006.01)
*H03F 3/217* (2006.01)

(52) U.S. Cl.
CPC ............ *H03F 2200/453* (2013.01); *H03F 2203/45026* (2013.01)

(56) References Cited

U.S. PATENT DOCUMENTS

| | | | | |
|---|---|---|---|---|
| 8,866,500 B2 * | 10/2014 | Kremin | ............ | G01R 27/2605 324/658 |
| 2005/0007150 A1 * | 1/2005 | Omote | ............ | H04L 25/028 326/83 |
| 2006/0192598 A1 * | 8/2006 | Baird | ............ | H03L 7/099 327/100 |
| 2007/0279094 A1 | 12/2007 | Jiang | | |
| 2008/0136465 A1 | 6/2008 | Takagi | | |
| 2008/0242255 A1 * | 10/2008 | Tamura | ............ | H03F 3/45183 455/334 |
| 2009/0140778 A1 * | 6/2009 | Kikuchi | ............ | H03F 3/45197 327/108 |
| 2010/0225395 A1 * | 9/2010 | Patterson | ............ | H03F 3/4508 330/253 |
| 2010/0231266 A1 | 9/2010 | Kishor | | |
| 2011/0068833 A1 * | 3/2011 | Hebert | ............ | H03G 1/0088 327/109 |
| 2011/0133837 A1 * | 6/2011 | Komori | ............ | H03F 3/45475 330/254 |
| 2012/0313665 A1 * | 12/2012 | Ochoa | ............ | G05F 1/613 326/104 |
| 2013/0069720 A1 * | 3/2013 | Reisiger | ............ | H03F 3/45188 330/253 |
| 2013/0195165 A1 * | 8/2013 | Poulton | ............ | H04B 1/04 375/229 |
| 2016/0241235 A1 * | 8/2016 | Hasegawa | ............ | H03K 19/017545 |

FOREIGN PATENT DOCUMENTS

| | | |
|---|---|---|
| JP | 2008-182418 A | 8/2008 |
| JP | 2009-531925 A | 9/2009 |
| WO | WO 03/049291 A1 | 6/2003 |

* cited by examiner

F I G. 3
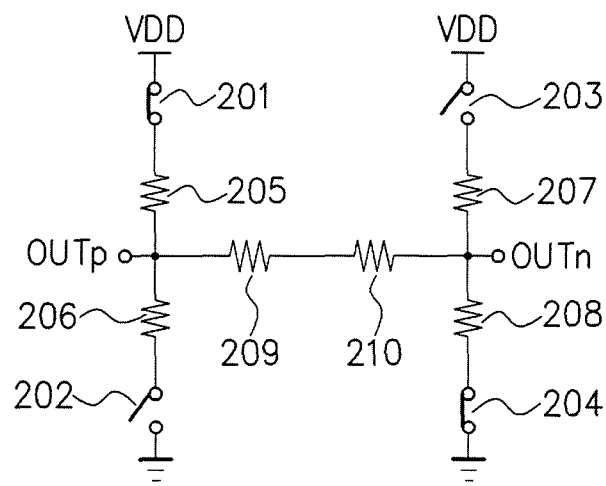
F I G. 4
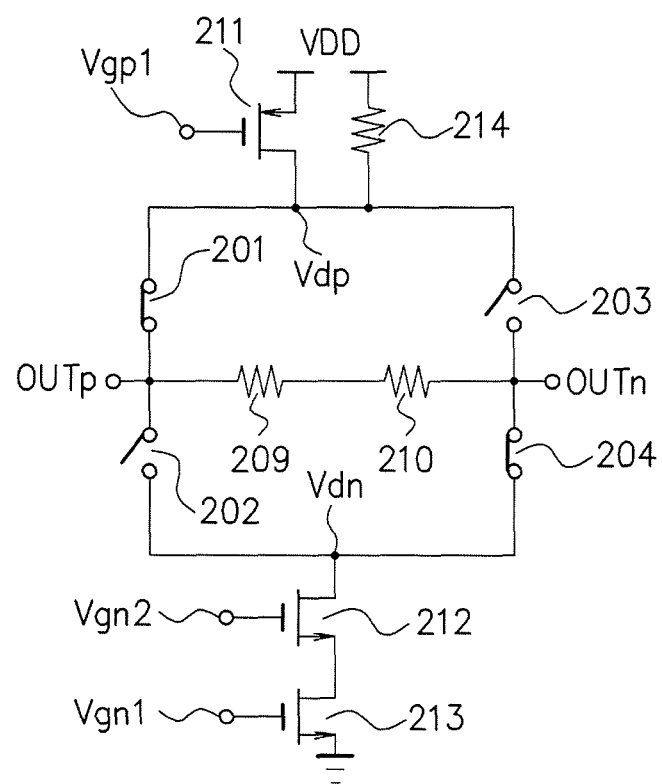

| | REFERENCE VALUE | REPRESENTATIVE VALUE 25℃ | LOWEST RATE VALUE 25℃ | HIGHEST RATE VALUE 25℃ | REPRESENTATIVE VALUE 110℃ | REPRESENTATIVE VALUE 0℃ | UNIT |
|---|---|---|---|---|---|---|---|
| POWER SUPPLY VOLTAGE | 1.20 | 1.20 | 1.20 | 1.20 | 1.20 | 1.20 | V |
| FREQUENCY | 28.2 | 28.2 | 28.2 | 28.2 | 28.2 | 28.2 | Gbps |
| OUTPUT IMPEDANCE(DIFFERENTIAL) | 100.0 | 106.5 | 102.8 | 99.7 | 104.8 | 107.4 | Ω |
| OUTPUT AMPLITUDE(DIFFERENTIAL) | 1.20 | 1.62 | 1.64 | 1.61 | 1.57 | 1.62 | V |
| DRIVER CURRENT | 6.00 | 8.10 | 8.20 | 8.07 | 7.85 | 8.10 | mA |

TRANSMISSION CIRCUIT AND SEMICONDUCTOR INTEGRATED CIRCUIT

CROSS-REFERENCE TO RELATED APPLICATION

This application is a continuation application of International Application PCT/JP2014/073367 filed on Sep. 4, 2014 and designated the U.S., the entire contents of which are incorporated herein by reference.

FIELD

The embodiment discussed herein is directed to a transmission circuit and a semiconductor integrated circuit.

BACKGROUND

There is known a differential driver having a plurality of switches coupled to a current source for steering of current depending on a differential data input end (refer to Patent Document 1). A first differential output end and a second differential output end are formed by a resistor coupled between at least two of the plurality of switches. A first source follower and a second source follower are coupled to the first differential output end and the second differential output end in order to control output impedance.

Further, there is known a semiconductor integrated circuit having a current output buffer circuit which is driven by a constant current, and in which output impedance is controlled corresponding to a bit rate of differential transmission signal input (refer to Patent Document 2). A signal waveform to be outputted from the current output buffer circuit to a signal transmission path is controlled corresponding to the bit rate of the transmission signal.

Further, there is known an amplifier circuit having an amplifying part whose mutual conductance changes depending on a bias current (refer to Patent Document 3). A constant voltage source outputs a constant voltage. A constant current source outputs a constant current. A differential pair is composed of a pair of transistors having differential inputs to which the constant voltage is inputted, and the constant current is supplied through an output end of one of the pair of transistors. A pair of input current terminals is connected to the output ends of the pair of transistors. A difference current detection means outputs a voltage signal proportional to a difference output current of the differential pair. Each of first and second voltage-current conversion means receives the voltage signal as an input signal, and outputs current proportional to the voltage signal. The output currents by the first and second voltage-current conversion means compose bias currents of the differential pair and the amplifying part respectively.

[Patent Document 1] Japanese National Publication of International Patent Application No. 2009-531925

[Patent Document 2] Japanese Laid-open Patent Publication No. 2008-147940

[Patent Document 3] Japanese Laid-open Patent Publication No. 2001-251149

In a transmission circuit, trying to make amplitude of an output signal large results in small output impedance, and thus it becomes difficult to take impedance matching. It is difficult to maintain the output impedance at a predetermined value (for example, 50Ω) and at the same time make the amplitude of the output signal of the transmission circuit large in order to take the impedance matching.

SUMMARY

A transmission circuit includes a driver circuit that includes a first transistor to regulate output impedance, and a switching circuit that is connected to the first transistor and switches an output polarity for differential output; and a bias circuit that includes: a first replica circuit including a second transistor corresponding to the first transistor, the bias circuit generating a gate voltage so as to make a current-voltage characteristic of the first transistor correspond to a first output impedance value, and supply the gate voltage to a gate of the first transistor.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 3 is an equivalent circuit diagram of the transmission circuit in FIG. 2;

FIG. 4 is an equivalent circuit diagram illustrating a configuration example of a driver circuit in FIG. 8;

DESCRIPTION OF EMBODIMENTS

Figure 1:
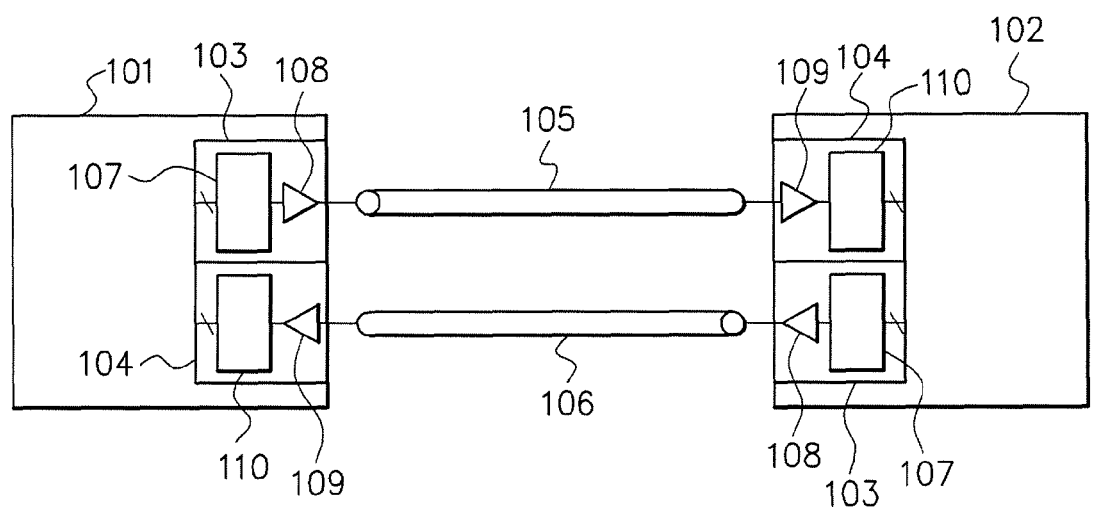
FIG. 1 is a diagram illustrating a configuration example of a communication system according to this embodiment.

FIG. 1 is a diagram illustrating a configuration example of a communication system according to this embodiment. The communication system has semiconductor integrated circuits 101, 102 and transmission paths 105, 106. Each of the semiconductor integrated circuits 101 and 102 is, for example, a central processing unit (CPU), and has a transmission device 103 and a reception device 104 in addition to an unillustrated internal circuit. The transmission device 103 has a parallel-serial conversion circuit 107 and a transmission circuit 108. The reception device 104 has a reception circuit 109 and a serial-parallel conversion circuit 110. The semiconductor integrated circuits 101 and 102 are connected by the transmission paths 105 and 106.

The parallel-serial conversion circuit 107, for example, converts 32-bit parallel data outputted from the internal circuit into one-bit serial data, and outputs the serial data to the transmission circuit 108. The transmission circuit 108 in the semiconductor integrated circuit 101 transmits the serial data via the transmission path 105 to the reception circuit 109 in the semiconductor integrated circuit 102. The transmission circuit 108 in the semiconductor integrated circuit 102 transmits the serial data via the transmission path 106 to the reception circuit 109 in the semiconductor integrated circuit 101. The reception circuit 109 receives the serial data and outputs the received serial data to the serial-parallel conversion circuit 110. The serial-parallel conversion circuit 110 converts one-bit serial data into, for example, 32-bit parallel data and outputs the parallel data to the internal circuit.

Characteristic impedance of each of the transmission paths 105 and 106 is 50Ω. When the transmission paths 105 and 106 are long and frequency of each signal to be transmitted therethrough is high, losses of the transmission paths 105 and 106 become large, and therefore, it is demanded that the transmission circuits 108 each output the signal with large amplitude. Further, in order to take matching with input terminating resistors of the reception circuits 109, output impedance of 50Ω (100Ω in differential output) of the transmission circuits 108 is set as a standard.

Figure 2:
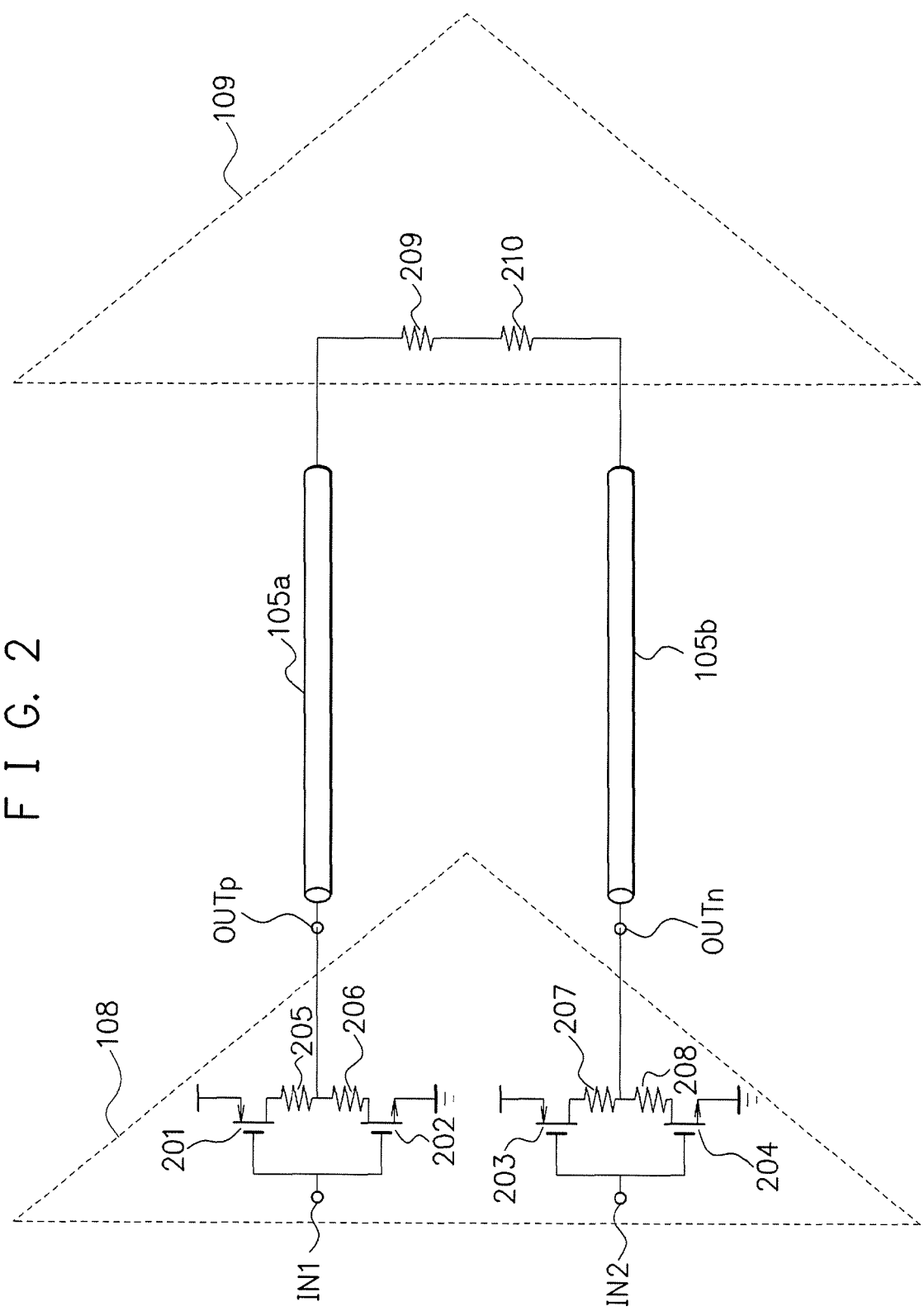
FIG. 2 is a diagram illustrating a basic configuration example of a transmission circuit and a reception circuit.

FIG. 2 is a diagram illustrating a basic configuration example of the transmission circuit 108 and the reception circuit 109. First, a configuration of the transmission circuit 108 will be described. In a p-channel field-effect transistor 201, a source is connected to a power supply potential node, a gate is connected to a differential input terminal IN1, and a drain is connected via a resistor 205 to a differential output terminal OUTp. In an n-channel field-effect transistor 202, a source is connected to a ground potential node, a gate is connected to the differential input terminal IN1, and a drain is connected via a resistor 206 to the differential output terminal OUTp.

In a p-channel field-effect transistor 203, a source is connected to a power supply potential node, a gate is connected to a differential input terminal IN2, and a drain is connected via a resistor 207 to a differential output terminal OUTn. In an re-channel field-effect transistor 204, a source is connected to a ground potential node, a gate is connected to the differential input terminal IN2, and a drain is connected via a resistor 208 to the differential output terminal OUTn.

To the differential input terminals IN1 and IN2, a differential signal based on the serial data inputted from the parallel-serial conversion circuit 107 (FIG. 1) is inputted. To the differential input terminals IN1 and IN2, binary digital data whose logic levels are inverted to each other are inputted.

When the differential input terminal IN1 is high-level and the differential input terminal IN2 is low-level, the n-channel field-effect transistor 202 and the p-channel field-effect transistor 203 are turned on and the p-channel field-effect transistor 201 and the n-channel field-effect transistor 204 are turned off. Thus, the differential output terminal OUTp becomes low-level and the differential output terminal OUTn becomes high-level.

On the other hand, when the differential input terminal IN1 is low-level and the differential input terminal IN2 is high-level, the p-channel field-effect transistor 201 and the n-channel field-effect transistor 204 are turned on and the n-channel field-effect transistor 202 and the p-channel field-effect transistor 203 are turned off. Thus, the differential output terminal OUTp becomes high-level and the differential output terminal OUTn becomes low-level.

The differential output terminals OUTp and OUTn output a differential signal of the binary digital data whose logic levels are inverted to each other. The differential output terminal OUTp is connected via a transmission path 105a to the reception circuit 109. The differential output terminal OUTn is connected via a transmission path 105b to the reception circuit 109. The transmission paths 105a and 105b correspond to the transmission path 105 in FIG. 1.

The reception circuit 109 has a serial connection of input terminating resistors 209 and 210. Each resistance of the input terminating resistors 209 and 210 is 50Ω. The serial connection of the input terminating resistors 209 and 210 has resistance of 100Ω, and is connected between the differential output terminals OUTp and OUTn.

FIG. 3 is an equivalent circuit diagram of the transmission circuit 108 in FIG. 2. The transmission circuit 108 has the p-channel field-effect transistors 201, 203, the n-channel field-effect transistors 202, 204, and the resistors 205 to 208. The input terminating resistors 209 and 210 are provided in the reception circuit 109, and are a load on the transmission circuit 108.

In the p-channel field-effect transistor 201, the source is connected to the power supply potential node VDD and the drain is connected via the resistor 205 to the differential output terminal OUTp. In the n-channel field-effect transistor 202, the source is connected to the ground potential node and the drain is connected via the resistor 206 to the differential output terminal OUTp. In the p-channel field-effect transistor 203, the source is connected to the power supply potential node VDD and the drain is connected via the resistor 207 to the differential output terminal OUTn. In the n-channel field-effect transistor 204, the source is connected to the ground potential node and the drain is connected via the resistor 208 to the differential output terminal OUTn. The serial connection of the input terminating resistors 209 and 210 are connected between the differential output terminals OUTp and OUTn.

Each resistance of the resistors 205 to 208 is 50Ω. Each resistance of the input terminating resistors 209 and 210 is 50Ω as well. Thus, it is difficult to make amplitude of the differential output signal outputted from the differential output terminals OUTp and OUTn large. For example, voltage of the power supply potential node VDD is 1.2 V, voltage of the differential output terminal OUTp is 0.9 V, and voltage of the differential output terminal OUTn is 0.3 V. Making the resistance of the resistors 205 to 208 small enables large amplitude of the differential output signal outputted from the differential output terminals OUTp and OUTn, but makes it impossible to keep the output impedance of the transmission circuit 108 at 50Ω (100Ω in differential output). As a result, it becomes impossible to take impedance matching. Thus, the transmission circuit 108 capable of maintaining the output impedance at a predetermined value and at the same time making amplitude of an output signal large will be described in reference to FIG. 8.

Figures 8, 9:
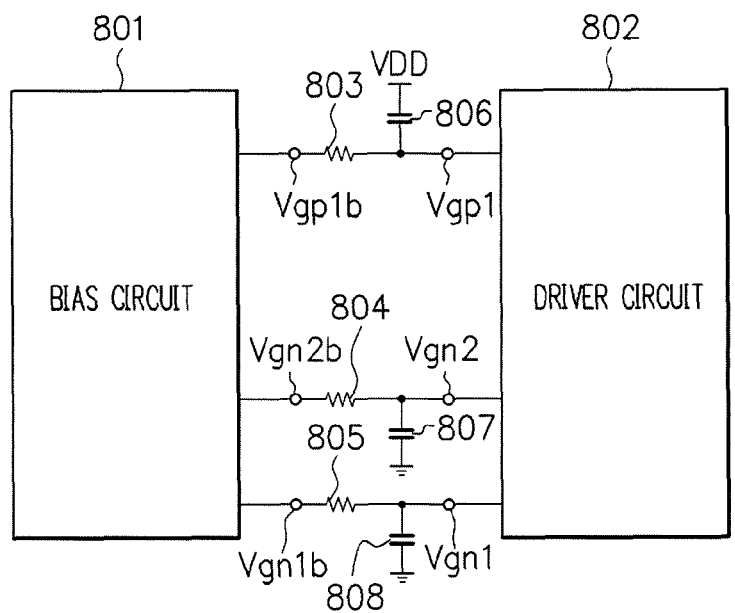
FIG. 8 is a diagram illustrating a configuration example of the transmission circuit according to this embodiment.
FIG. 9 is a chart representing characteristics of the transmission circuit according to this embodiment.

FIG. 8 is a diagram illustrating a configuration example of the transmission circuit 108 according to this embodiment. The transmission circuit 108 has a bias circuit 801, a driver circuit 802, resistors 803 to 805, and capacitors 806 to 808. The bias circuit 801 has nodes Vgp1b, Vgn1b, and Vgn2b. The driver circuit 802 has nodes Vgp1, Vgn1, and Vgn2.

The resistor 803 is connected between the node Vgp1b of the bias circuit 801 and the node Vgp1 of the driver circuit 802. The capacitor 806 is connected between the power supply potential node VDD and the node Vgp1 of the driver circuit 802. The resistor 804 is connected between the node Vgn2b of the bias circuit 801 and the node Vgn2 of the driver circuit 802. The capacitor 807 is connected between the ground potential node and the node Vgn2 of the driver circuit 802. The resistor 805 is connected between the node Vgn1b of the bias circuit 801 and the node Vgn1 of the driver circuit 802. The capacitor 808 is connected between the ground potential node and the node Vgn1 of the driver circuit 802.

The node Vgp1b of the bias circuit 801 outputs voltage to the node Vgp1 of the driver circuit 802. The node Vgn2b of the bias circuit 801 outputs voltage to the node Vgn2 of the driver circuit 802. The node Vgn1b of the bias circuit 801 outputs voltage to the node Vgn1 of the driver circuit 802.

FIG. 4 is an equivalent circuit diagram illustrating a configuration example of the driver circuit 802 in FIG. 8. The driver circuit 802 in FIG. 4 is the one in which the resistors 205 to 208 are eliminated and a p-channel field-effect transistor 211, n-channel field-effect transistors 212, 213, and a second resistor 214 are added with respect to the transmission circuit in FIG. 3.

The driver circuit 802 has the p-channel field-effect transistors 201, 203, 211, the n-channel field-effect transistors 202, 204, 212, 213, and the second resistor 214. The input terminating resistors 209 and 210, as illustrated in FIG. 2, are provided in the reception circuit 109, and are the load on the driver circuit 802.

The p-channel field-effect transistors 201, 203 and the n-channel field-effect transistors 202, 204 in FIG. 4 correspond to the p-channel field-effect transistors 201, 203 and the n-channel field-effect transistors 202, 204 in FIG. 2. The input terminating resistors 209 and 210 in FIG. 4 correspond to the input terminating resistors 209 and 210 in FIG. 2.

In the p-channel field-effect transistor 211, a source is connected to the power supply potential node VDD, a gate is connected to the node Vgp1, and a drain is connected to a node Vdp. The second resistor 214 has resistance of 50Ω, and is connected between the power supply potential node VDD and the node Vdp. That is, the second resistor 214 is connected to the p-channel field-effect transistor 211 in parallel.

In the p-channel field-effect transistor 201, the source is connected to the node Vdp and the drain is connected to the differential output terminal OUTp. In the n-channel field-effect transistor 202, the source is connected to a node Vdn and the drain is connected to the differential output terminal OUTp. In the p-channel field-effect transistor 203, the source is connected to the node Vdp and the drain is connected to the differential output terminal OUTn. In the n-channel field-effect transistor 204, the source is connected to the node Vdn and the drain is connected to the differential output terminal OUTn. The serial connection of the input terminating resistors 209 and 210 is connected between the differential output terminals OUTp and OUTn. The p-channel field-effect transistors 201, 203 and the n-channel field-effect transistors 202, 204 are switching circuits which switch an output polarity for differential output.

In the n-channel field-effect transistor 212, a drain is connected to the node Vdn and a gate is connected to the node Vgn2. In the n-channel field-effect transistor 213, a drain is connected to a source of the n-channel field-effect transistor 212, a gate is connected to the node Vgn1, and a source is connected to the ground potential node. That is, the n-channel field-effect transistor 213 is cascode-connected to the n-channel field-effect transistor 212.

Voltage of the node Vgn2 is regulated so that resistance of the cascode connection of the re-channel field-effect transistors 212 and 213 is 50Ω. Thus, the output impedance of the transmission circuit 108 including the driver circuit 802 is regulated at 50Ω.

Figure 5:
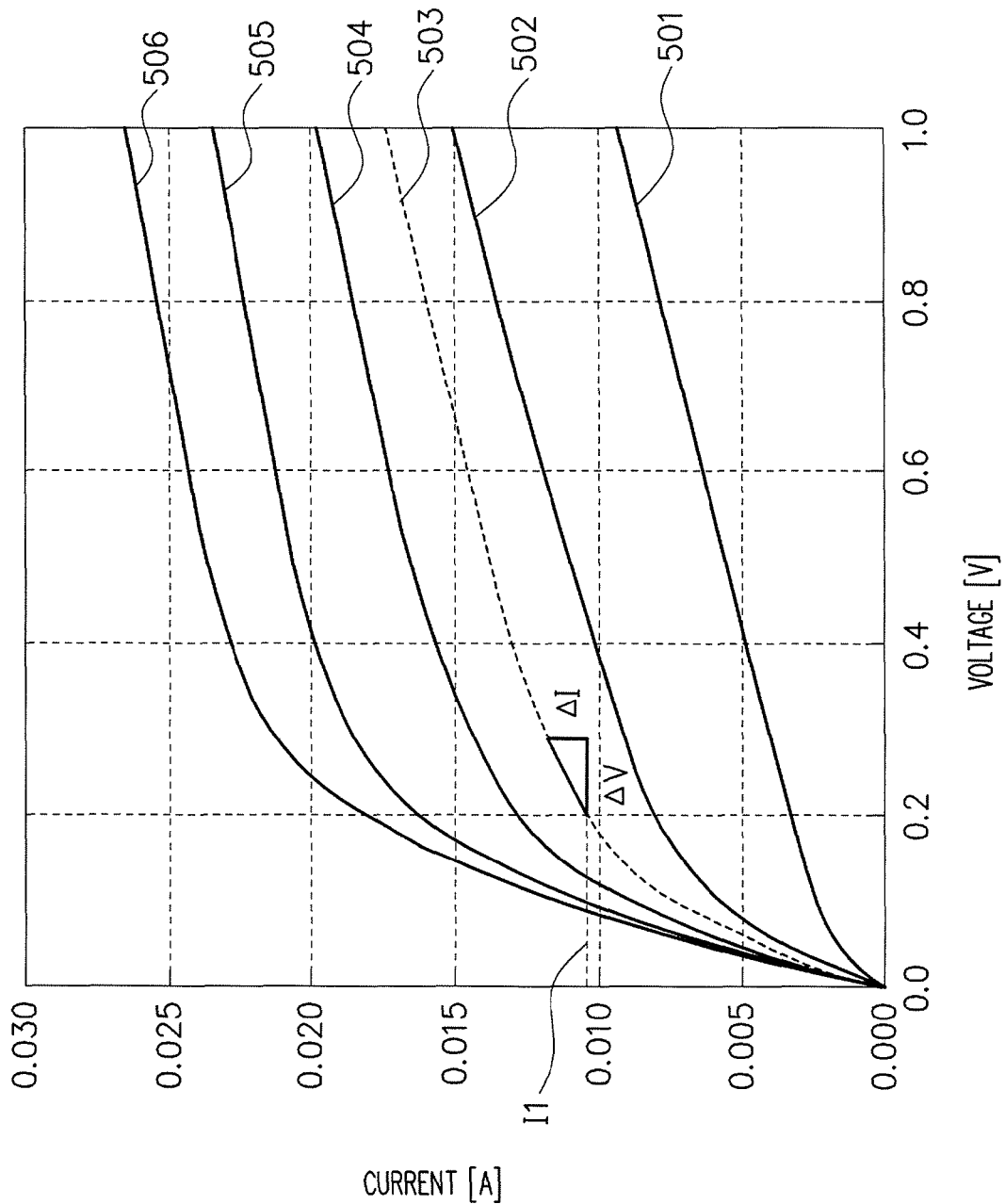
FIG. 5 is a graph representing current-voltage characteristics of a cascode connection of n-channel field-effect transistors.

FIG. 5 is a graph representing current-voltage characteristics of the cascode connection of the n-channel field-effect transistors 212 and 213. A horizontal axis represents drain voltage of the re-channel field-effect transistor 212 (voltage of the node Vdn). A vertical axis represents drain current of the n-channel field-effect transistor 212. Note that voltage of the node Vgn1 connected to the gate of the n-channel field-effect transistor 213 is fixed.

A characteristic line 501 represents a characteristic when the voltage of the node Vgn2 connected to the gate of the n-channel field-effect transistor 212 is 0.4 V. A characteristic line 502 represents a characteristic when the voltage of the node Vgn2 connected to the gate of the n-channel field-effect transistor 212 is 0.5 V. A characteristic line 503 represents a characteristic when the voltage of the node Vgn2 connected to the gate of the n-channel field-effect transistor 212 is 0.55 V. A characteristic line 504 represents a characteristic when the voltage of the node Vgn2 connected to the gate of the n-channel field-effect transistor 212 is 0.6 V. A characteristic line 505 represents a characteristic when the voltage of the node Vgn2 connected to the gate of the n-channel field-effect transistor 212 is 0.7 V. A characteristic line 506 represents a characteristic when the voltage of the node Vgn2 connected to the gate of the n-channel field-effect transistor 212 is 0.8 V.

When the drain voltage of the n-channel field-effect transistor 212 (voltage of the node Vdn) is set at, for example, 0.2 V, a slope of the current-voltage characteristic is $\Delta I/\Delta V=20$ mS ($\Delta V/\Delta I=50\Omega$) on the characteristic line 503 when the gate voltage is 0.55 V. At this time, the drain current of the n-channel field-effect transistor 212 is current I1. Accordingly, the bias circuit 801 (FIG. 8) may regulate the voltage of the node Vgn2 connected to the gate of the n-channel field-effect transistor 212 so as to obtain $\Delta V/\Delta I=50\Omega$. Thus, the resistance of the cascode connection of the re-channel field-effect transistors 212 and 213 becomes 50Ω.

Figure 6:
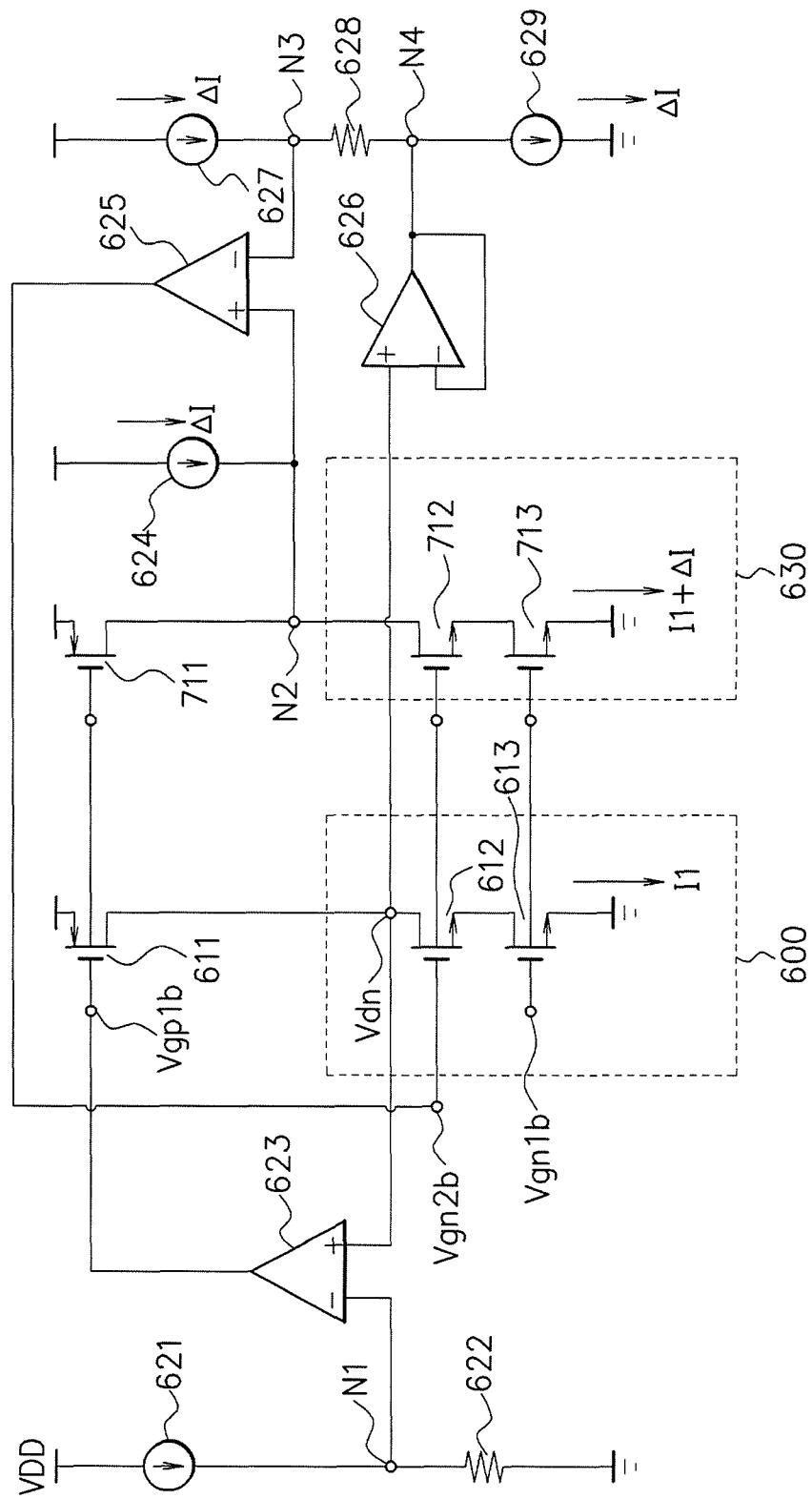
FIG. 6 is a circuit diagram illustrating a basic configuration example of a bias circuit in FIG. 8.

FIG. 6 is a circuit diagram illustrating a basic configuration example of the bias circuit 801 in FIG. 8. The bias circuit 801 has a first replica circuit 600 and a second replica circuit 630.

The first replica circuit 600 has n-channel field-effect transistors 612 and 613. The first replica circuit 600 is the replica circuit of the cascode connection of the n-channel field-effect transistors 212 and 213 in FIG. 4. The n-channel field-effect transistor 612 corresponds to the n-channel field-effect transistor 212 in FIG. 4. The n-channel field-effect transistor 613 corresponds to the n-channel field-effect transistor 213 in FIG. 4.

The second replica circuit 630 has re-channel field-effect transistors 712 and 713. The second replica circuit 630 is the replica circuit of the cascode connection of the n-channel field-effect transistors 212 and 213 in FIG. 4. The n-channel field-effect transistor 712 corresponds to the n-channel field-effect transistor 212 in FIG. 4. The n-channel field-effect transistor 713 corresponds to the n-channel field-effect transistor 213 in FIG. 4.

A current source 621 is connected between the power supply potential node VDD and a node N1. A resistor 622 is connected between the node N1 and the ground potential node. In a second operational amplifier 623, reference voltage of the node N1 is inputted to a negative input terminal, voltage of a node Vdn is inputted to a positive input terminal, and an output terminal outputs gate voltage to the node Vgp1b.

In a p-channel field-effect transistor 611, a source is connected to the power supply potential node VDD, a gate is connected to the node Vgp1b, and a drain is connected to the node Vdn. In the re-channel field-effect transistor 612, a drain is connected to the node Vdn and a gate is connected to the node Vgn2b. In the n-channel field-effect transistor 613, a drain is connected to a source of the n-channel field-effect transistor 612, a gate is connected to the node Vgn1b, and a source is connected to the ground potential node. To the node Vgn1b, fixed voltage is supplied. The voltage of the node Vgn2b is regulated so that a first current I1 (FIG. 5) flows through the n-channel field-effect transistors 612 and 613.

In a p-channel field-effect transistor 711, a source is connected to the power supply potential node VDD, a gate is connected to the node Vgp1b, and a drain is connected to a node N2. In the n-channel field-effect transistor 712, a drain is connected to the node N2 and a gate is connected to the node Vgn2b. In the n-channel field-effect transistor 713, a drain is connected to a source of the n-channel field-effect transistor 712, a drain is connected to the node Vgn1b, and a source is connected to the ground potential node.

A current source 624 is connected between the power supply potential node VDD and the node N2 and a second current ΔI (FIG. 5) flows therethrough. Through each of the p-channel field-effect transistors 611 and 711, the first current I1 flows. Through the n-channel field-effect transistors 712 and 713, current I1+ΔI which is the sum of the first current I1 and the second current ΔI flows.

In a first operational amplifier 625, voltage of the node N2 is inputted to a positive input terminal, voltage of a node N3 is inputted to a negative input terminal, and an output terminal outputs gate voltage to the node Vgn2b. In a third operational amplifier 626, a positive input terminal is connected to the node Vdn, and an output terminal and a negative input terminal are connected to a node N4.

A current source 627 is connected between the power supply potential node VDD and the node N3 and the second current ΔI flows therethrough. A first resistor 628 has resistance of 50Ω, and is connected between the node N3 and the node N4. A current source 629 is connected between the node N4 and the ground potential node and the second current ΔI flows therethrough.

Because current of the current source 621 flows through the resistor 622, the reference voltage (for example, 0.2 V) is generated at the node N1. The voltage of the node Vdn is drain voltage of the n-channel field-effect transistor 612. The second operational amplifier 623 controls the voltage of the node Vgp1b so that the voltage of the node Vdn is the same as the reference voltage of the node N1. Thus, the voltage of the node Vdn becomes fixed voltage of 0.2 V (FIG. 5), for example.

An increase of drain voltage of the re-channel field-effect transistor 712 when the drain current of the n-channel field-effect transistor 712 increases by the second current ΔI is ΔV (FIG. 5). In this case, the voltage of the node N2 is voltage Vdn+ΔV which is the sum of ΔV and the voltage of the node Vdn.

Further, in order to enable ΔV/ΔI=50Ω in FIG. 5, the current sources 627 and 629 make the second current ΔI flow through the first resistor 628 having the resistance of 50Ω. Voltage of the node N4 becomes the same as the voltage of the node Vdn by a voltage follower of the third operational amplifier 626. Thus, the voltage of the node N3 becomes voltage Vdn+ΔI×50Ω which is the sum of voltage ΔI×50Ω and the voltage of the node N4.

The first operational amplifier 625 controls voltage of the node Vgn2b so that the voltage Vdn+ΔI×50Ω of the node N3 is the same as the voltage Vdn+ΔV of the node N2. This results in ΔV=ΔI×50Ω, and the resistance of the cascode connection of the n-channel field-effect transistors 612 and 613 becomes 50Ω.

The bias circuit 801 outputs the voltages of the nodes Vgp1b, Vgn1b, and Vgn2b generated as described above to the driver circuit 802. In the driver circuit 802, as illustrated in FIG. 4, the voltage of the node Vgp1b is applied to the gate of the p-channel field-effect transistor 211 and the voltage of the node Vgn2b is applied to the gate of the n-channel field-effect transistor 212, and the voltage of the node Vgn1b is applied to the gate of the n-channel field-effect transistor 213. The p-channel field-effect transistor 211 corresponds to the p-channel field-effect transistor 611 in FIG. 6. The n-channel field-effect transistor 212 corresponds to the n-channel field-effect transistor 612 in FIG. 6. The n-channel field-effect transistor 213 corresponds to the n-channel field-effect transistor 613 in FIG. 6.

Consequently, resistance of the n-channel field-effect transistors 212 and 213 becomes 50Ω the same as that of the n-channel field-effect transistors 612 and 613 in FIG. 6. That is, the output impedance of the transmission circuit 108 becomes 50Ω, and it is possible to take the impedance matching.

Further, in the driver circuit 802 in FIG. 4, the elimination of the resistors 205 to 208 with respect to the transmission circuit in FIG. 3 makes it possible to make the amplitude of the output signal large. In the transmission circuit in FIG. 3, when the voltage of the power supply potential node VDD is 1.2 V, the voltage of the differential output terminal OUTp is 0.9 V and the voltage of the differential output terminal OUTn is 0.3 V. On the other hand, in the driver circuit 802 in FIG. 4, when the voltage of the power supply potential node VDD is 1.2 V, the voltage of the differential output terminal OUTp is 1.0 V and the voltage of the differential output terminal OUTn is 0.2 V. Consequently, it is possible to make the amplitude of the output signal of the differential output terminals OUTp and OUTn of the driver circuit 802 in FIG. 4 large.

The equivalent circuit of the driver circuit 802 in FIG. 4 is connected to the input terminating resistors 209 and 210 of the reception circuit 109. Further, the driver circuit 802 has the second resistor 214 in order to make voltage of the node Vdp stable. Then, a bias circuit 801 which is designed, with the above-described input terminating resistors 209, 210, and the second resistor 214 taken into consideration in the bias circuit 801 in FIG. 6 in order to make the bias circuit 801 in FIG. 6 correspond to the driver circuit 802 in FIG. 4 will be illustrated in FIG. 7.

Figure 7:
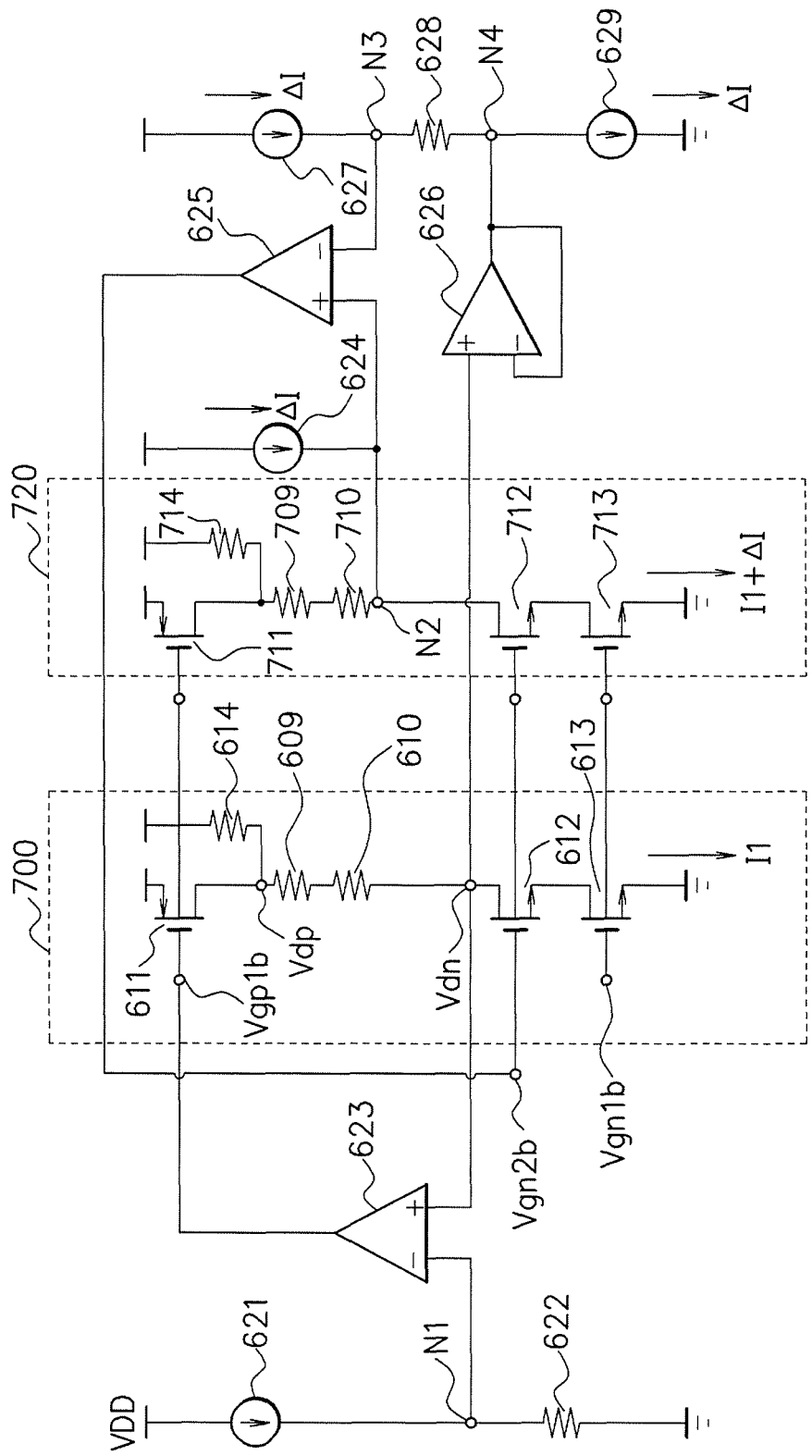
FIG. 7 is a circuit diagram illustrating a configuration example of the bias circuit in FIG. 8.

FIG. 7 is a circuit diagram illustrating a configuration example of the bias circuit 801 in FIG. 8. The bias circuit 801 in FIG. 7 is the one in which a third resistor 614, fifth resistors 609, 610, a fourth resistor 714, and sixth resistors 709, 710 are added to the bias circuit 801 in FIG. 6. Hereinafter, points where the bias circuit 801 in FIG. 7 is different from the bias circuit 801 in FIG. 6 will be described.

The third resistor 614 has resistance of 50Ω, and is connected between the power supply potential node VDD and a node Vdp. That is, the third resistor 614 is connected to the p-channel field-effect transistor 611 in parallel. Each resistance of the fifth resistors 609 and 610 is 50Ω. A serial connection of the fifth resistors 609 and 610 is connected between the nodes Vdp and Vdn.

The fourth resistor 714 has resistance of 50Ω, and is connected between the power supply potential node VDD and the drain of the p-channel field-effect transistor 711. That is, the fourth resistor 714 is connected to the p-channel field-effect transistor 711 in parallel. Each resistance of the sixth resistors 709 and 710 is 50Ω. A serial connection of the sixth resistors 709 and 710 is connected between the drain of the p-channel field-effect transistor 711 and the node N2.

A first replica circuit 700 has the p-channel field-effect transistor 611, the third resistor 614, the fifth resistors 609, 610, and the n-channel field-effect transistors 612, 613. The first replica circuit 700 is the replica circuit of the driver circuit 802 in FIG. 4.

The p-channel field-effect transistor 611 corresponds to the p-channel field-effect transistor 211 in FIG. 4. The third resistor 614 corresponds to the second resistor 214 in FIG. 4. The fifth resistors 609 and 610 correspond to the input terminating resistors 209 and 210 in FIG. 4. The n-channel field-effect transistor 612 corresponds to the n-channel field-effect transistor 212 in FIG. 4. The n-channel field-effect transistor 613 corresponds to the n-channel field-effect transistor 213 in FIG. 4.

A second replica circuit 720 has the p-channel field-effect transistor 711, the fourth resistor 714, the sixth resistors 709, 710, and n-channel field-effect transistors 712, 713. The second replica circuit 720 is the replica circuit of the driver circuit 802 in FIG. 4.

The p-channel field-effect transistor 711 corresponds to the p-channel field-effect transistor 211 in FIG. 4. The fourth resistor 714 corresponds to the second resistor 214 in FIG. 4. The sixth resistors 709 and 710 correspond to the input terminating resistors 209 and 210 in FIG. 4. The n-channel field-effect transistor 712 corresponds to the n-channel field-effect transistor 212 in FIG. 4. The n-channel field-effect transistor 713 corresponds to the n-channel field-effect transistor 213 in FIG. 4.

Each voltage of the nodes in FIG. 7 is the same as each voltage of the nodes in FIG. 6. The node Vdn is fixed at the same voltage (for example, 0.2 V) as the voltage of the node N1. Through the n-channel field-effect transistors 612 and 613, the first current I1 flows. Through the n-channel field-effect transistors 712 and 713, the current I1+ΔI flows. The voltage of the node N2 is the voltage Vdn+ΔV. The voltage of the node N4 is the same voltage as the voltage of the node Vdn. The voltage of the node N3 is the voltage Vdn+ΔI× 50Ω. The bias circuit 801 in FIG. 7 performs the same operation as that of the bias circuit 801 in FIG. 6.

The bias circuit 801 in FIG. 7 generates gate voltage so as to make the current-voltage characteristic (FIG. 5) of the n-channel field-effect transistors 212 and 213 correspond to the output impedance of 50Ω, and via the node Vgn2$b$, supplies the gate voltage to the gate of the n-channel field-effect transistor 212.

Through the n-channel field-effect transistors 612 and 613, the first current I1 flows. Through the n-channel field-effect transistors 712 and 713, the current I1+ΔI which is the sum of the first current I1 and the second current ΔI flows. Through the first resistor 628, the second current ΔI flows.

To the first operational amplifier 625, the voltage Vdn+ ΔI×50Ω which is the sum of the voltage ΔI×50Ω of the first resistor 628 and the drain voltage of the n-channel field-effect transistor 612 (the voltage of the node Vdn) and the drain voltage Vdn+ΔV of the n-channel field-effect transistor 712 are inputted, and the first operational amplifier 625, via the node Vgn2$b$, outputs voltage to the gates of the n-channel field-effect transistors 212, 612, 712.

To the second operational amplifier 623, the drain voltage of the n-channel field-effect transistor 612 (the voltage of the node Vdn) and the reference voltage of the node N1 are inputted, and the second operational amplifier 623, via the node Vgp1$b$, outputs voltage to the gates of the p-channel field-effect transistors 211, 611, 711.

The first operational amplifier 625 controls the voltage of the node Vgn2$b$ so that the voltage Vdn+ΔI×50Ω of the node N3 is the same as the voltage Vdn+ΔV of the node N2. This results in ΔV=ΔI×50Ω, and the resistance of the n-channel field-effect transistors 612 and 613 becomes 50Ω.

The bias circuit 801 in FIG. 7 outputs the voltages of the nodes Vgp1$b$, Vgn1$b$, and Vgn2$b$ generated as described above to the driver circuit 802. The p-channel field-effect transistor 211 in FIG. 4 corresponds to the p-channel field-effect transistor 611 in FIG. 7. The n-channel field-effect transistor 212 in FIG. 4 corresponds to the n-channel field-effect transistor 612 in FIG. 7. The n-channel field-effect transistor 213 in FIG. 4 corresponds to the n-channel field-effect transistor 613 in FIG. 7.

Consequently, the resistance of the n-channel field-effect transistors 212 and 213 becomes 50Ω the same as that of the n-channel field-effect transistors 612 and 613 in FIG. 7. That is, the output impedance of the transmission circuit 108 becomes 50Ω, and it is possible to take the impedance matching.

Further, in the driver circuit 802 in FIG. 4, the elimination of the resistors 205 to 208 with respect to the transmission circuit in FIG. 3 makes it possible to make the amplitude of the output signal large. In the driver circuit 802 in FIG. 4, when the voltage of the power supply potential node VDD is 1.2 V, the voltage of the differential output terminal OUTp is 1.0 V and the voltage of the differential output terminal OUTn is 0.2 V. It is possible to make the amplitude of the output signal of the differential output terminals OUTp and OUTn of the driver circuit 802 in FIG. 4 large.

FIG. 9 is a chart representing a characteristic of the transmission circuit 108 according to this embodiment. A reference value represents an ideal characteristic of the transmission circuit 108 in FIG. 3. A representative value at 25° C., a lowest rate value at 25° C., a highest rate value at 25° C., a representative value at 110° C., and a representative value at 0° C. represent simulation results of the characteristic of the transmission circuit 108 in FIG. 8 according to this embodiment (including the driver circuit 802 in FIG. 4 and the bias circuit 801 in FIG. 7).

The output impedance (differential) of the transmission circuit 108 according to this embodiment is about 100Ω, and is within the standard. Thus, it is possible to take the impedance matching.

Output amplitude (differential) of the reference value will be described. In the transmission circuit 108 in FIG. 3, when the voltage of the power supply potential node VDD is 1.2 V and the differential output terminal OUTp is high-level, the voltage of the differential output terminal OUTp is 0.9 V and the voltage of the differential output terminal OUTn is 0.3 V. This results in OUTp−OUTn=0.9 V−0.3 V=+0.6 V. On the other hand, when the voltage of the power supply potential node VDD is 1.2 V and the differential output terminal OUTp is low-level, the voltage of the differential output terminal OUTp is 0.3 V and the voltage of the differential output terminal OUTn is 0.9 V. This results in OUTp−OUTn=0.3 V−0.9 V=−0.6 V. Consequently, amplitude being difference between when the differential output terminal OUTp is high-level and when the differential output terminal OUTp is low-level is +0.6 V−(−0.6 V)=1.2 V.

Next, output amplitude (differential) of this embodiment will be described. In the driver circuit 802 in FIG. 4, when the voltage of the power supply potential node VDD is 1.2 V and the differential output terminal OUTp is high-level, the voltage of the differential output terminal OUTp is 1.0 V and the voltage of the differential output terminal OUTn is 0.2 V. This results in OUTp−OUTn=1.0 V−0.2 V=+0.8 V. On the other hand, when the voltage of the power supply potential node VDD is 1.2 V and the differential output terminal OUTp is low-level, the voltage of the differential output terminal OUTp is 0.2 V and the voltage of the differential output terminal OUTn is 1.0 V. This results in OUTp−OUTn=0.2 V−1.0 V=−0.8 V. Consequently, the amplitude being difference between when the differential output terminal OUTp is high-level and when the differential output terminal OUTp is low-level is +0.8 V−(−0.8 V)=1.6 V. The output amplitude (differential) in the simulation results of this embodiment is about 1.6 V, and large compared with the reference value (1.2 V).

Note that the above embodiments merely illustrate concrete examples of implementing the present embodiment, and the technical scope of the present embodiment is not to be construed in a restrictive manner by these embodiments. That is, the present embodiment may be implemented in various forms without departing from the technical spirit or main features thereof.

Providing the bias circuit makes it possible to maintain the output impedance at the predetermined value and at the same time make the amplitude of the output signal large.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A transmission circuit comprising:
  a driver circuit that includes:
    a first transistor configured to regulate output impedance, and
    a switching circuit that is connected to the first transistor and configured to switch an output polarity for differential output; and
  a bias circuit that includes:
  a first replica circuit including a second transistor corresponding to the first transistor, the bias circuit being configured to generate a gate voltage so as to make a current-voltage characteristic of the first transistor correspond to a first output impedance value, and supply the gate voltage to a gate of the first transistor.

2. The transmission circuit according to claim 1,
wherein the first transistor includes:
  a third transistor configured to regulate the output impedance; and
  a fourth transistor that is cascode-connected to the third transistor and be supplied with a fixed voltage at a gate,
wherein the second transistor includes
  fifth and sixth transistors corresponding to the third and fourth transistors, and
wherein the bias circuit generates a gate voltage so as to make a current-voltage characteristic of the third and fourth transistors correspond to the first output impedance value, and supply the gate voltage to a gate of the third transistor.

3. The transmission circuit according to claim 2,
wherein the bias circuit includes
  a second replica circuit including seventh and eighth transistors corresponding to the third and fourth transistors,
wherein a first current flows through the fifth transistor,
wherein current which is a sum of the first current and a second current flows through the seventh transistor, and wherein the bias circuit includes:
  a first resistor through which the second current flows; and
  a first operational amplifier configured to receive a first voltage and a drain voltage of the seventh transistor, the first voltage being which is a sum of a voltage of the first resistor and a drain voltage of the fifth transistor and configured to output a second voltage to gates of the third, fifth, and seventh transistors.

4. The transmission circuit according to claim 2,
wherein the cascode connection of the third and fourth transistors is provided between the switching circuit and a ground potential node, and
wherein the driver circuit includes:
  a ninth transistor that is connected between the switching circuit and a power supply potential node; and
  a second resistor that is connected to the ninth transistor in parallel.

5. The transmission circuit according to claim 4,
wherein the first replica circuit includes:
  a tenth transistor corresponding to the ninth transistor; and
  a third resistor corresponding to the second resistor, and
wherein the driver circuit includes a second operational amplifier configured to receive a drain voltage of the fifth transistor and a reference voltage and to output a third voltage to gates of the ninth and tenth transistors.

6. The transmission circuit according to claim 3,
wherein the cascode connection of the third and fourth transistors is provided between the switching circuit and a ground potential node,
wherein the driver circuit includes:
  a ninth transistor that is connected between the switching circuit and a power supply potential node; and
  a second resistor that is connected to the ninth transistor in parallel,
wherein the first replica circuit includes:
  a tenth transistor corresponding to the ninth transistor; and
  a third resistor corresponding to the second resistor,
wherein the second replica circuit includes:
  an eleventh transistor corresponding to the ninth transistor; and
  a fourth resistor corresponding to the second resistor, and
wherein the driver circuit includes a second operational amplifier configured to receive a drain voltage of the fifth transistor and a reference voltage and to a fourth output voltage to gates of the ninth, tenth, and eleventh transistors.

7. The transmission circuit according to claim 5,
wherein the first replica circuit includes a fifth resistor that is connected between the fifth transistor and the tenth transistor and corresponds to an input terminating resistor of a reception circuit.

8. The transmission circuit according to claim 6,
wherein the first replica circuit includes a fifth resistor that is connected between the fifth transistor and the tenth transistor and corresponds to an input terminating resistor of a reception circuit, and
wherein the second replica circuit includes a sixth resistor that is connected between the seventh transistor and the eleventh transistor and corresponds to an input terminating resistor of a reception circuit.

9. A semiconductor integrated circuit comprising:
an internal circuit; and
a transmission circuit configured to receive data from the internal circuit, wherein the transmission circuit includes:
a driver circuit that includes;
a first transistor configured to regulate output impedance; and
a switching circuit that is connected to the first transistor and configured to switch an output polarity for differential output, and
a bias circuit that includes
a first replica circuit configured to include a second transistor corresponding to the first transistor,
the bias circuit being configured to generate gate voltage so as to make a current-voltage characteristic of the first transistor correspond to a first output impedance value, and supply the gate voltage to a gate of the first transistor.

10. The semiconductor integrated circuit according to claim 9,
wherein the first transistor includes:
a third transistor configured to regulate the output impedance; and
a fourth transistor that is cascode-connected to the third transistor and be supplied with a fixed voltage at a gate,
wherein the second transistor includes
fifth and sixth transistors corresponding to the third and fourth transistors, and
wherein the bias circuit generates a gate voltage so as to make a current-voltage characteristic of the third and fourth transistors correspond to the first output impedance value, and supply the gate voltage to a gate of the third transistor.

11. The semiconductor integrated circuit according to claim 10,
wherein the bias circuit includes
a second replica circuit including seventh and eighth transistors corresponding to the third and fourth transistors,
wherein a first current flows through the fifth transistor,
wherein current which is a sum of the first current and a second current flows through the seventh transistor, and
wherein the bias circuit includes:
a first resistor through which the second current flows; and
a first operational amplifier configured to receive a first voltage and a drain voltage of the seventh transistor, the first voltage being which is a sum of a voltage of the first resistor and a drain voltage of the fifth transistor and configured to output a second voltage to gates of the third, fifth, and seventh transistors.

12. The semiconductor integrated circuit according to claim 10,
wherein the cascode connection of the third and fourth transistors is provided between the switching circuit and a ground potential node, and
wherein the driver circuit includes:
a ninth transistor that is connected between the switching circuit and a power supply potential node; and
a second resistor that is connected to the ninth transistor in parallel.

13. The semiconductor integrated circuit according to claim 12,
wherein the first replica circuit includes:
a tenth transistor corresponding to the ninth transistor; and
a third resistor corresponding to the second resistor, and
wherein the driver circuit includes a second operational amplifier configured to receive a drain voltage of the fifth transistor and reference voltage and to output a third voltage to gates of the ninth and tenth transistors.

14. The semiconductor integrated circuit according to claim 11,
wherein the cascode connection of the third and fourth transistors is provided between the switching circuit and a ground potential node,
wherein the driver circuit includes:
a ninth transistor that is connected between the switching circuit and a power supply potential node; and
a second resistor that is connected to the ninth transistor in parallel,
wherein the first replica circuit includes:
a tenth transistor corresponding to the ninth transistor; and
a third resistor corresponding to the second resistor,
wherein the second replica circuit includes:
an eleventh transistor corresponding to the ninth transistor; and
a fourth resistor corresponding to the second resistor, and
wherein the driver circuit includes a second operational amplifier configured to receive a drain voltage of the fifth transistor and a reference voltage and to a fourth output voltage to gates of the ninth, tenth, and eleventh transistors.

15. The semiconductor integrated circuit according to claim 13,
wherein the first replica circuit includes a fifth resistor that is connected between the fifth transistor and the tenth transistor and corresponds to an input terminating resistor of a reception circuit.

16. The semiconductor integrated circuit according to claim 14,
wherein the first replica circuit includes a fifth resistor that is connected between the fifth transistor and the tenth transistor and corresponds to an input terminating resistor of a reception circuit, and
wherein the second replica circuit includes a sixth resistor that is connected between the seventh transistor and the eleventh transistor and corresponds to an input terminating resistor of a reception circuit.

* * * * *